United States Patent
Gill

(10) Patent No.: US 7,084,467 B2
(45) Date of Patent: Aug. 1, 2006

(54) SPIN VALVE TRANSISTOR WITH SELF-PINNED ANTIPARALLEL PINNED LAYER STRUCTURE

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/627,293

(22) Filed: Jul. 25, 2003

(65) Prior Publication Data
US 2005/0017314 A1 Jan. 27, 2005

(51) Int. Cl.
H01L 29/82 (2006.01)
(52) U.S. Cl. .................. 257/421; 257/427
(58) Field of Classification Search ........... 257/427, 257/421–424
See application file for complete search history.

(56) References Cited

U.S. PATENT DOCUMENTS

| | | | |
|---|---|---|---|
| 6,295,187 B1 * | 9/2001 | Pinarbasi | 360/324.11 |
| 6,400,536 B1 * | 6/2002 | Gill | 360/324.12 |
| 6,480,365 B1 | 11/2002 | Gill et al. | 360/324.11 |
| 6,501,143 B1 | 12/2002 | Sato et al. | 257/421 |
| 6,655,006 B1 * | 12/2003 | Pinarbasi | 29/603.07 |
| 2002/0024780 A1 * | 2/2002 | Mao et al. | 360/324.11 |
| 2002/0181169 A1 * | 12/2002 | Pinarbasi | 360/324.11 |
| 2003/0214004 A1 * | 11/2003 | Sato et al. | 257/427 |
| 2004/0061984 A1 * | 4/2004 | Ito et al. | 360/324.2 |
| 2004/0257192 A1 * | 12/2004 | Mori et al. | 338/32 R |

FOREIGN PATENT DOCUMENTS

| JP | 2000-322717 | * 11/2000 |
|---|---|---|
| JP | 2003-289163 | * 10/2003 |

* cited by examiner

Primary Examiner—Nathan J. Flynn
Assistant Examiner—Ahmed N. Sefer
(74) Attorney, Agent, or Firm—Ervin F. Johnston; Matthew S. Zises

(57) ABSTRACT

A spin valve transistor includes an emitter, a collector, a base between the emitter and the collector, a spin valve which includes a free layer structure, a self-pinned antiparallel (AP) pinned layer structure and a nonmagnetic spacer layer between the free layer structure and the AP pinned layer structure wherein the base includes at least the free layer structure.

21 Claims, 7 Drawing Sheets

SPIN VALVE TRANSISTOR WITH SELF-PINNED ANTIPARALLEL PINNED LAYER STRUCTURE

BACKGROUND OF THE INVENTION

1. Field of the Invention

The present invention relates to a spin valve transistor with a self-pinned antiparallel (AP) pinned layer structure wherein first and second AP pinned layers of the AP pinned layer structure comprise different materials for self-biasing the AP pinned layer structure.

2. Description of the Related Art

The heart of a computer is a magnetic disk drive which includes a rotating magnetic disk, a slider that has read and write heads, a suspension arm above the rotating disk and an actuator arm that swings the suspension arm to place the read and write heads over selected circular tracks on the rotating disk. When the disk is not rotating the actuator arm parks the suspension arm and slider on a ramp. When the disk rotates and the slider is positioned by the actuator arm above the disk, air is swirled by the rotating disk adjacent an air bearing surface (ABS) of the slider causing the slider to ride on an air bearing a slight distance from the surface of the rotating disk. The ABS is an exposed surface of the slider and the write and read heads that face the rotating disk. When the slider rides on the air bearing, the actuator arm positions the write and read heads over the selected circular tracks on the rotating disk where signal fields are written and read by the write and read heads. The read and write heads are connected to processing circuitry that operates according to a computer program to implement the writing and reading functions.

An exemplary high performance read head employs a current perpendicular to the planes (CPP) sensor, such as a magnetic tunnel junction (MTJ) sensor, for sensing the magnetic field signals from the rotating magnetic disk. The MTJ sensor includes an insulative tunneling or barrier spacer layer sandwiched between a ferromagnetic pinned layer and a ferromagnetic free layer. An antiferromagnetic pinning layer interfaces the pinned layer for pinning the magnetic moment of the pinned layer 90° to the air bearing surface (ABS). The MTJ sensor is located between ferromagnetic first and second shield layers. First and second leads, which may be the first and second shield layers, are connected to the MTJ sensor for conducting a tunneling current therethrough. The tunneling current is conducted perpendicular to the major film planes (CPP) of the sensor as contrasted to a spin valve sensor where the sense current is conducted parallel to or, otherwise stated, conducted in the planes of the major thin film planes (CIP) of the spin valve sensor. Another type of CPP sensor employs a nonmagnetic electrically conductive spacer layer instead of an insulation material spacer layer. In both types, a magnetic moment of the free layer is free to rotate upwardly and downwardly with respect to the ABS from a quiescent or zero bias point position in response to positive and negative magnetic signal fields from the rotating magnetic disk. The quiescent position of the magnetic moment of the free layer, which is parallel to the ABS, occurs when the tunneling current is conducted through the sensor without magnetic signal fields from the rotating magnetic disk.

When the magnetic moments of the pinned and free layers are parallel with respect to one another the resistance of the CPP sensor to the tunneling current ($I_T$) is at a minimum and when the magnetic moments are antiparallel the resistance of the CPP sensor to the tunneling current is at a maximum. Changes in resistance of the sensor is a function of cos θ, where θ is the angle between the magnetic moments of the pinned and free layers. When the tunneling current ($I_T$) is conducted through the sensor, resistance changes, due to signal fields from the rotating magnetic disk, cause potential changes that are detected and processed as playback signals. The sensitivity of the sensor is quantified as magnetoresistive coefficient dr/R where dr is the change in resistance of the sensor from minimum resistance (magnetic moments of free and pinned layers parallel) to maximum resistance (magnetic moments of the free and pinned layers antiparallel) and R is the resistance of the MTJ sensor at minimum resistance. The dr/R of a CPP sensor can be on the order of 40% as compared to 10% for a spin valve sensor.

Another type of sensor is a spin valve transistor (SVT) wherein the amount of current conducted therethrough is detected as playback signals. The SVT comprises an emitter, a collector and a base therebetween wherein the base comprises at least a portion of a CPP type of sensor. In an exemplary embodiment the CPP sensor comprises a free layer structure, a pinned layer structure and a nonmagnetic spacer layer therebetween. Input and output leads are connected to the emitter and collector respectively and are commonly connected to the base such as to the free layer. Hot electrons are injected by the emitter into the base and a portion of these hot electrons that are not scattered within the layers or at the interfaces of the layers are conducted through the base to the collector. The hot electrons which are scattered flow back to the emitter via a common base electrode. Only electrons that tunnel through an insulation layer, such as $Al_2O_3$, at the emitter are injected into the base. These are hot electrons which have an energy level above Fermi levels of the layers within the base. Only electrons above the Fermi levels contribute to conduction of electrons through the base. The mean free path of these hot electrons is long compared to lower energy electrons and they have a mean free path which is greater than the thickness of the spacer layer between the free and pinned layers.

Hot electrons, like all electrons, have a spin orientation. Spin up electrons are oriented in the same direction as the magnetic moment of the magnetized material and spin down electrons are antiparallel thereto. Because the spin up electrons are the majority of the electrons in the material the magnetic moment is in the same direction as the orientation of the spin up electrons. Accordingly, the spin up electrons are referred to as majority electrons and the spin down electrons are referred to as minority electrons. The conduction of the hot electrons through the base is spin-dependent upon the relative orientation of the magnetic moments of the free and pinned layers. When the magnetic moments of these layers are parallel the conduction of hot electrons through the spacer layer is high and when the magnetic moments of these layers are antiparallel the conduction of hot electrons through the spacer layer is low. The conductivity of hot electrons through the pinned layer structure is also important, which will be discussed in more detail hereinbelow.

With the ordinary CPP sensor, discussed hereinabove, a high magnetoresistive coefficient dr/R is sought because these resistance changes are manifested as potential changes which are processed as playback signals. The magnetoresistive coefficient dr/R of a CPP may be as high as 40% whereas the magnetoresistive coefficient dr/R of a SVT can easily exceed 200%. Instead of detecting potential changes as in the ordinary CPP, current changes between the base and collector are detected and processed as playback signals in a SVT. Unfortunately, a SVT can have a very low transfer coefficient which is the collector current to the emitter current ($I_C/I_E$). Accordingly, it is desirable to increase this coefficient in order to improve the read capability of a read head incorporating the SVT.

In commonly assigned U.S. Pat. No. 6,480,365, hereinafter referred to as Gill patent, and U.S. Pat. No. 6,501,143, hereinafter referred to as the Sato patent, spin valve transistors are discussed. Both the Gill patent and the Sato patent are incorporated by reference in their entireties herein. In the Gill patent a pinned layer is pinned by a pinning layer, such as platinum manganese (PtMn). The Sato patent does not describe the scheme for pinning the pinned layer structure. It is important that the entire base, including the pinned layer structure, be as thin as possible so as to minimize scattering of hot electrons. The platinum manganese (PtMn) pinning layer in the Gill patent is typically 150 Å thick which is also true for the Sato patent if a pinning layer pins his pinned layer.

SUMMARY OF THE INVENTION

The present invention provides the base of the SVT with a pinned layer structure which is self-pinned so as to obviate the need of a pinning layer. By eliminating the pinning layer, which is typically thick in comparison to the other layers, scattering of the hot electrons is minimized and the transfer coefficient ($I_C/I_E$) is improved. The pinned layer structure is an antiparallel (AP) pinned layer structure which has first and second AP pinned layers which are separated by a thin antiparallel coupling layer. One of the AP pinned layers has a higher positive magnetostriction than the other AP pinned layer. During fabrication of the head assemblies the heads are lapped to a head surface which causes compressive stress within the AP pinned layers. Because of a positive magnetostriction in the one AP pinned layer it will have a magnetostrictive uniaxial anisotropy which is oriented perpendicular to the head surface. After fabrication of the head assembly a strong magnetic field is applied to orient a magnetization of the sensor either into or out of the head perpendicular to the head surface. While the intrinsic uniaxial anisotropy field of the layer is much less than the magnetostrictive anisotropy field, these fields should be oriented parallel with respect to one another so that the magnetostrictive anisotropy field supports the intrinsic anisotropy field. The orientation of the intrinsic anisotropy field is set in a particular direction by sputter depositing the material in the presence of a field in that direction. Accordingly, the higher magnetostrictive anisotropy in one of the AP pinned layers self-pins the AP pinned layer structure without the necessity of a pinning layer and the elimination of the pinning layer increases conduction of hot electrons between the emitter and the collector through the base. In regard to self-pinned AP pinned layer structures reference is made to commonly assigned U.S. Pat. Nos. 6,127,053 and 5,583,725 which are incorporated by reference herein and commonly assigned copending patent application Ser. No. 10/104,712 filed Mar. 21, 2002, which is incorporated by reference herein.

Other aspects of the invention will be appreciated upon reading the following description taken together with the accompanying drawings wherein the various figures are not to scale with respect to one another nor are they to scale with the respect to the structure depicted therein.

DESCRIPTION OF THE PREFERRED EMBODIMENTS

Magnetic Disk Drive

Figure 1:
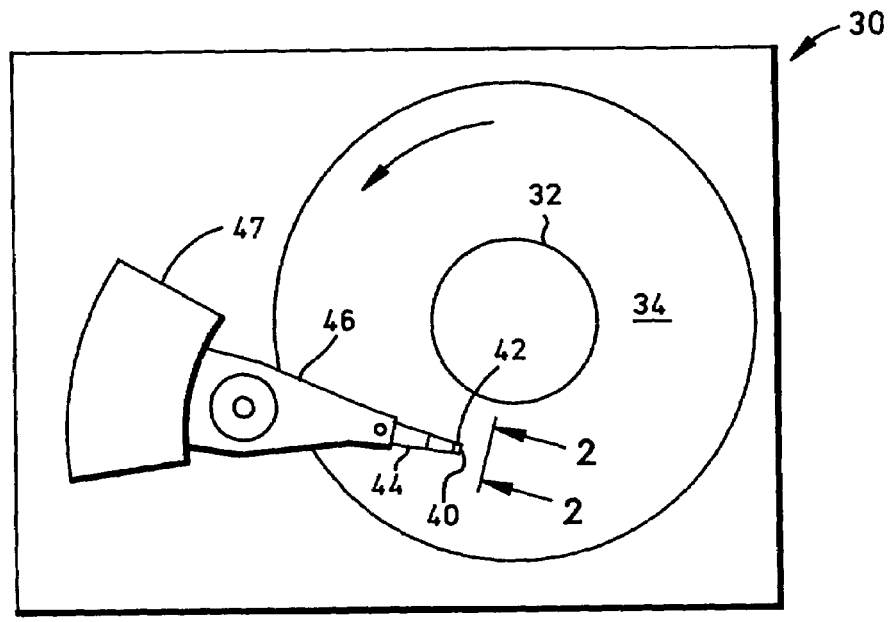
FIG. 1 is a plan view of an exemplary magnetic disk drive.
Figure 2:
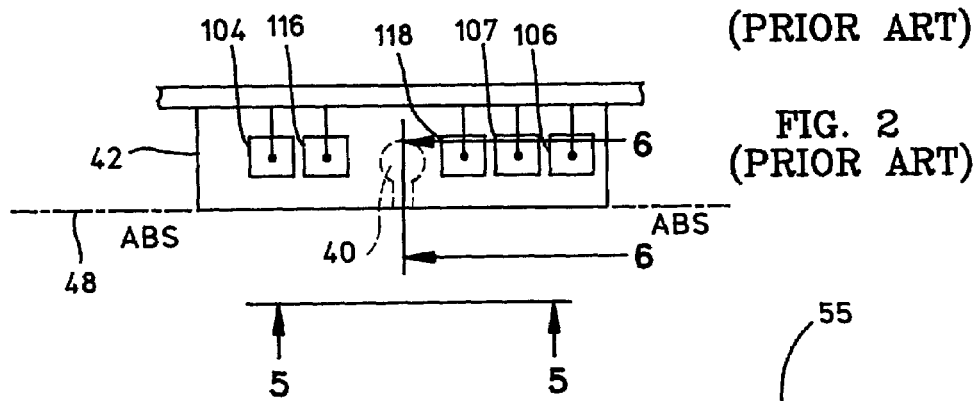
FIG. 2 is an end view of a slider with a magnetic head of the disk drive as seen in plane 2—2 of FIG. 1.
Figure 3:
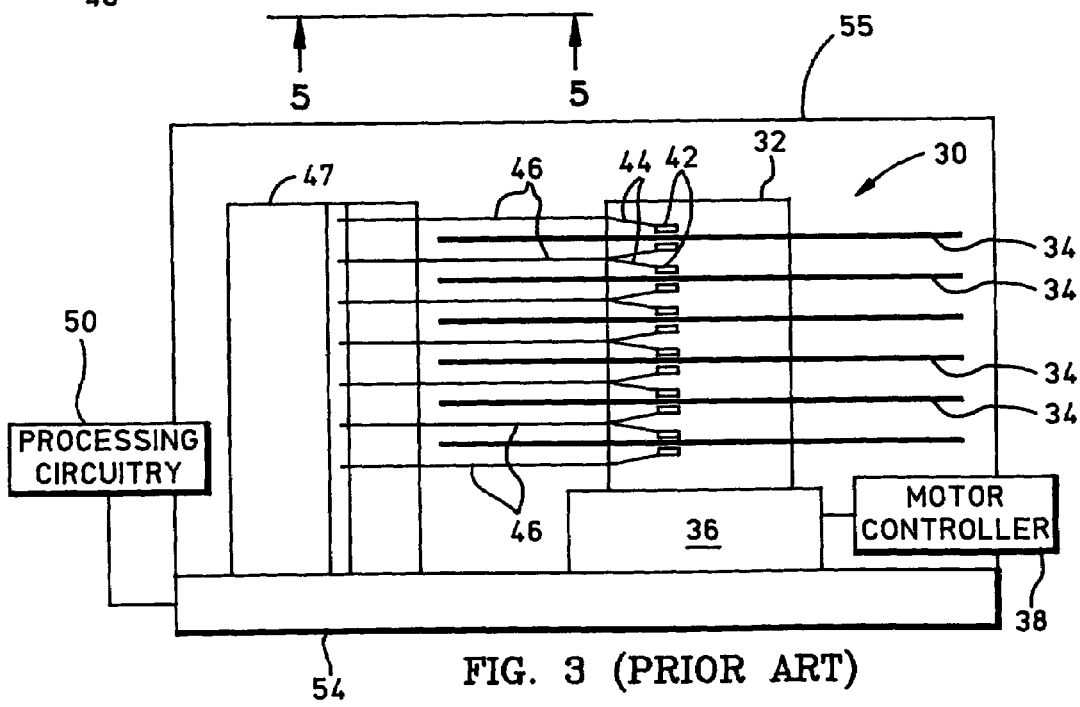
FIG. 3 is an elevation view of the magnetic disk drive wherein multiple disks and magnetic heads are employed.
Figure 4:
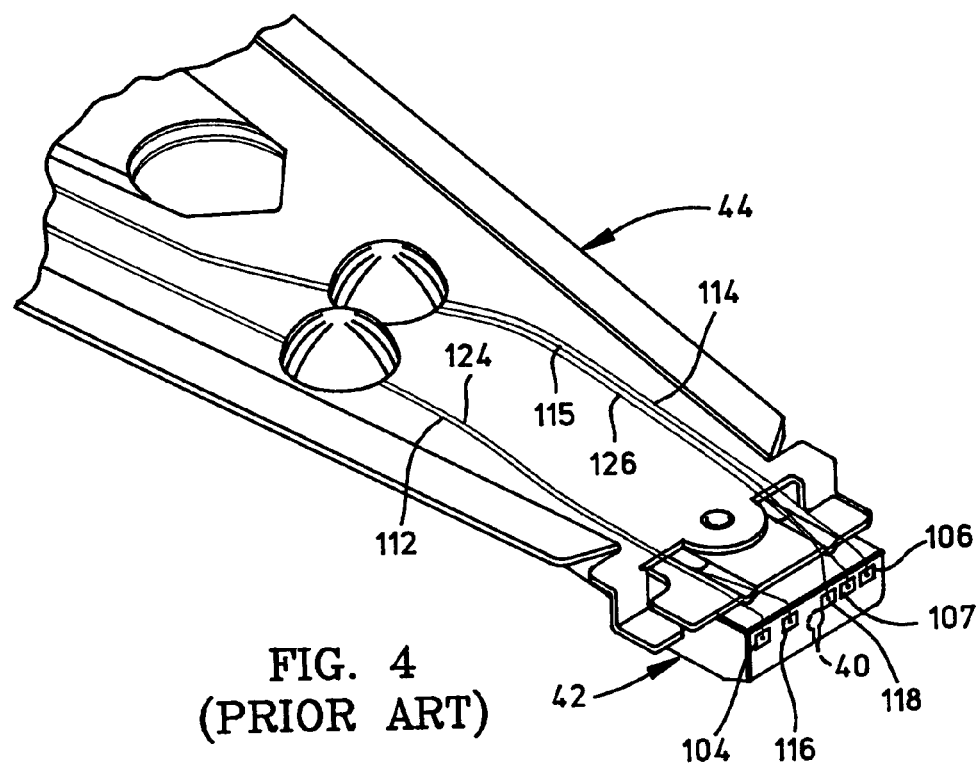
FIG. 4 is an isometric illustration of an exemplary suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates one or more magnetic disks 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.01 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing 55, as shown in FIG. 3.

Figure 5:
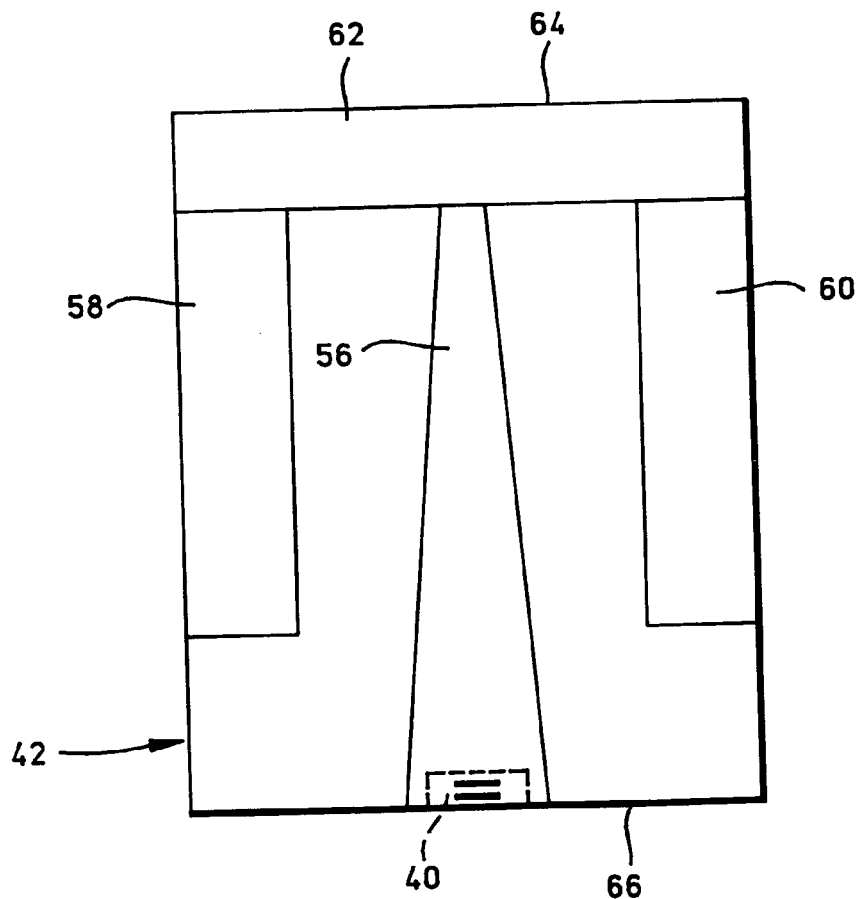
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
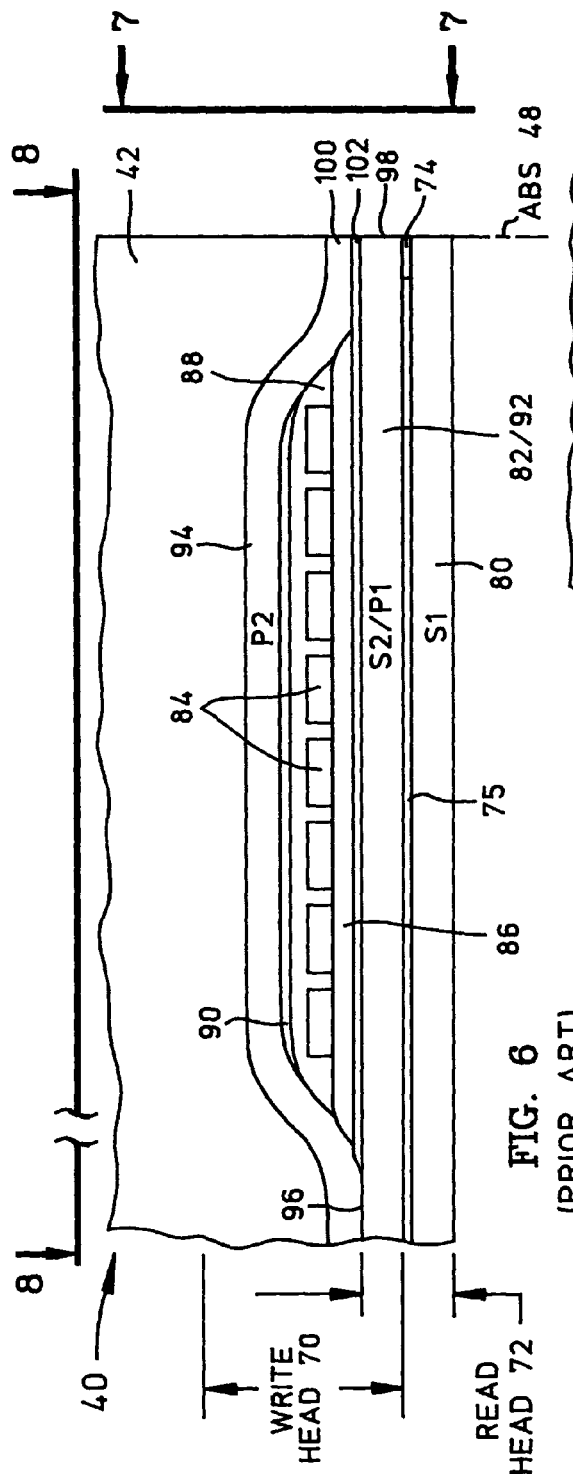
FIG. 6 is a partial view of the slider and a merged magnetic head as seen in plane 6—6 of FIG. 2.
Figure 7:
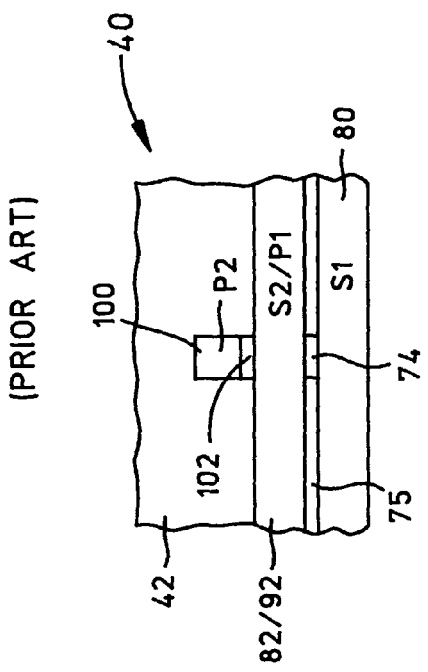
FIG. 7 is a partial ABS view of the slider taken along plane 7—7 of FIG. 6 to show the read and write elements of the merged magnetic head.

FIG. 6 is a side cross-sectional elevation view of a merged magnetic head 40, which includes a write head portion 70 and a read head portion 72, the read head portion employing a spin valve transistor (SVT) 74 of the present invention. FIG. 7 is an ABS view of FIG. 6. The SVT 74 is sandwiched between ferromagnetic first and second shield layers 80 and 82. In response to external magnetic fields, the current in the SVT 74 changes, which current changes are processed as readback signals by the processing circuitry 50 shown in FIG. 3. The current may be conducted through the SVT 74 perpendicular to the planes of its major film surfaces via the first and second shield layers 80 and 82.

Figure 8:
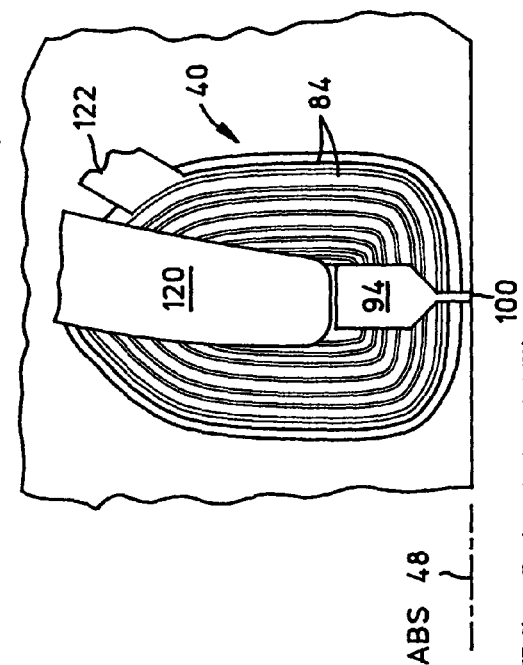
FIG. 8 is a view taken along plane 8—8 of FIG. 6 with all material above the coil layer and leads removed.

The write head portion 70 of the magnetic head 40 includes a coil layer 84 sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. In a piggyback head (not shown) the second shield layer 82 and the first pole piece layer 92 are separate layers and an insulation layer is located therebetween. As shown in FIGS. 2 and 4, first, second and third solder connections 104, 106 and 107 connect leads from the SVT 74 to leads 112, 114 and 115 on the suspension 44, and third and fourth solder connections 116 and 118 connect leads 120 and 122 from the coil 84 (see FIG. 8) to leads 124 and 126 on the suspension.

Figure 9:
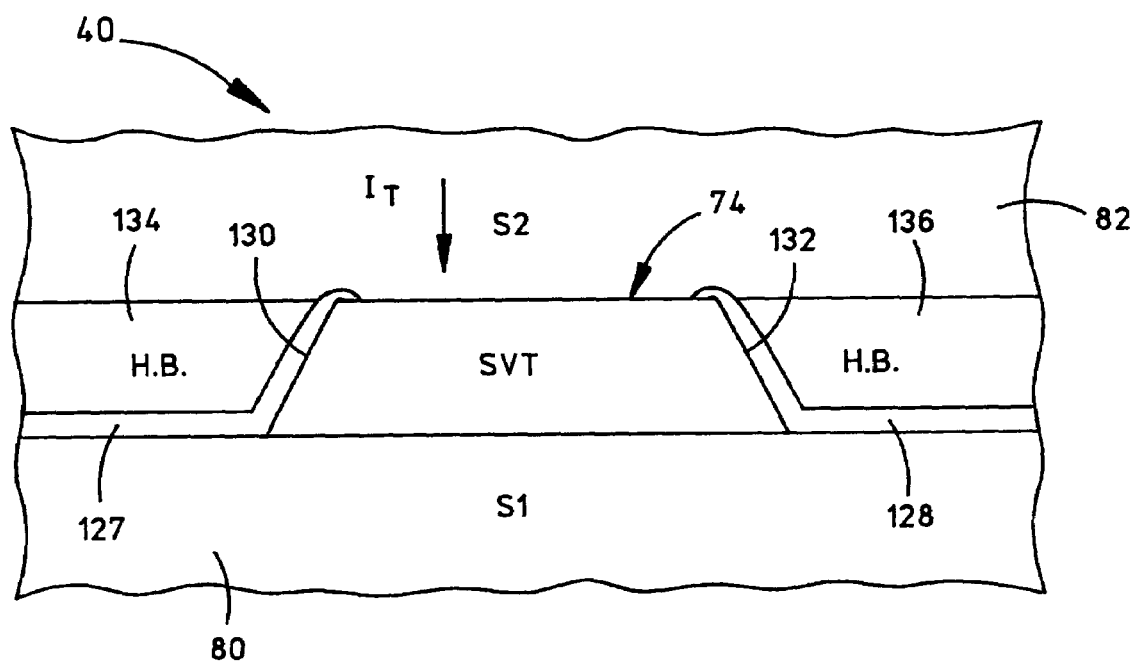
FIG. 9 is an enlarged ABS illustration of the read head with a prior art CPP sensor.

FIG. 9 is an enlarged isometric ABS illustration of the read head 40 shown in FIG. 7. The read head 40 includes the SVT 74. First and second insulation layers 127 and 128, such as alumina ($Al_2O_3$), cover the first shield layer 80 on each side of the SVT 74 as well as slightly covering first and second side walls 130 and 132 of the SVT. First and second hard bias layers 134 and 136 are on the insulation layers 127 and 128 and are adjacent the side walls 130 and 132. The hard bias layers 134 and 136 cause a magnetic field to extend longitudinally through the SVT 74 for stabilizing a free layer of the SVT. The SVT 74 and the first and second hard bias layers 134 and 136 are located between ferromagnetic first and second shield layers 80 and 82 which may serve as leads for conducting the current $I_T$ through the SVT 74.

Figure 10:
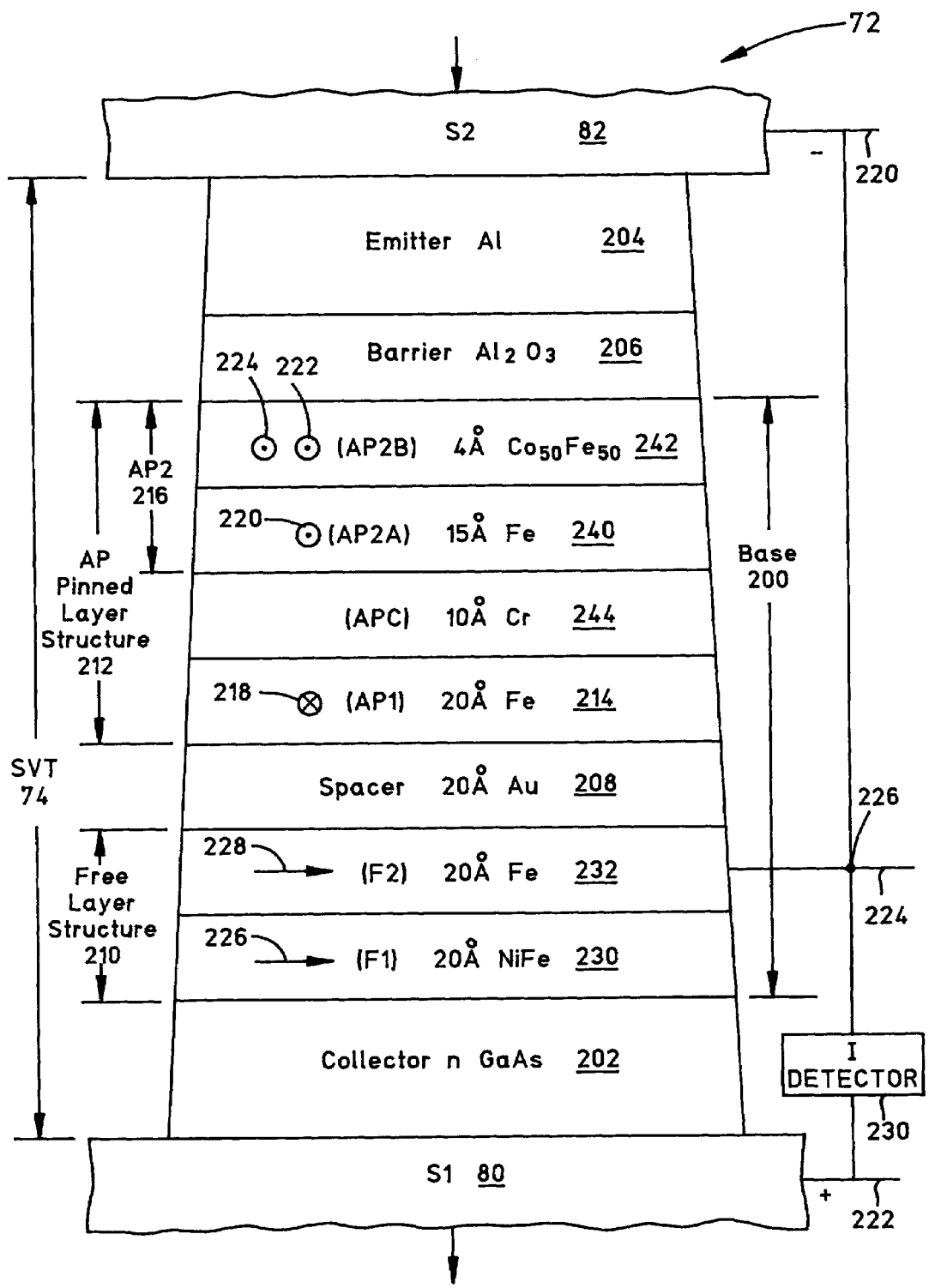
FIG. 10 is an ABS illustration of one embodiment of the present spin valve transistor.

FIG. 10 illustrates an ABS view of an exemplary first embodiment of the present invention wherein the spin valve transistor (SVT) 74 is located between the first and second shield layers 80 and 82. The spin valve transistor 74 includes a base 200 which is located between a collector 202 and an emitter 204. Located between the emitter 204 and the base is a nonmagnetic electrically nonconductive barrier layer 206 which may be aluminum oxide ($Al_2O_3$), and which is for a purpose to be described hereinafter. The base 200 is a CPP type of sensor which includes a nonmagnetic electrically conductive spacer layer 208 which is located between a free layer structure 210 and an antiparallel (AP) pinned layer structure 212 of the present invention. The AP pinned layer structure has first and second AP pinned layers (AP1) and (AP2) 214 and 216. The first AP pinned layer 214 has a magnetic moment 218 which is perpendicular to the ABS optionally in either direction, such as into the head as shown in FIG. 10, and the second AP pinned layer 216 has magnetic moments 220, 222 and 224 that are antiparallel to the magnetic moment 218. The free layer structure 210 has magnetic moments 226 and 228 which are parallel to the ABS and optionally in either direction, such as from left to right as shown in FIG. 10. When a signal field from a rotating magnetic disk rotates the magnetic moment 228 of the free layer into the head, so that the magnetic moments 228 and 218 become more parallel the conductance of the hot electrons between the emitter 204 and the collector 202 is increased, and when a signal field from the rotating magnetic disk rotates the magnetic moment 228 out of the head the magnetic moments 228 and 218 become more antiparallel, which decreases the conductance of the hot electrons between the emitter and the collector. A change in current is detected and processed as playback signals which will be discussed in more detail hereinafter.

The purpose of the barrier layer 206 is to ensure that only hot electrons from the emitter 204 are injected into the base 200. These hot electrons have an energy level which is above the Fermi levels of the layers in the base, as discussed hereinabove. The Fermi level of a particular layer depends upon the band structure of the layer which, in turn, depends upon certain concentrations of the majority and minority electrons. Electrons which have energy levels below the Fermi levels will not pass through the layers of the base 200. The free layer structure 210 may comprise first and second free layers (F1) and (F2) 230 and 232 wherein the first free layer 230 is nickel iron (NiFe) and the second free layer 232 is iron (Fe). The nickel iron of the first free layer imparts soft magnetic properties to the overall free layer structure 210 so that the free layer structure is more responsive to signal fields from the rotating magnetic disk.

Leads 220, 222 and 224 are connected to the processing circuitry 50 in FIG. 3 via the contacts 104, 106 and 107 in FIG. 4. Lead 220 may feed a negative voltage to the emitter 204 via the second shield layer 82 and lead 222 may have a positive connection to the collector 202 via the first shield layer 80. Leads 220 and 222 are connected to the lead 224 at 226 and the lead 224 is connected to the free layer structure 210. A current (I) detector 230, which is in reality a part of the processing circuitry 50 in FIG. 3, detects the amount of current between the leads 222 and 224 which is, in turn, processed by the processing circuitry 50 as playback signals.

The present invention provides the base 200 with a self-pinned AP pinned layer structure 212 which is exemplified in FIG. 10. An aspect of the invention is that the first AP pinned layer 214 is iron (Fe), a first film (AP2A) 240 of the second AP pinned layer is iron (Fe) and a second film (AP2B) 242 of the second AP pinned layer is cobalt iron (CoFe), such as $Co_{50}Fe_{50}$. Another aspect of the invention is that an antiparallel coupling (APC) layer 244 of chromium (Cr) is located between the first and second AP pinned layers 214 and 216. A further aspect of the invention is that the first and second AP pinned layers 214 and 216 have equal magnetic thicknesses.

A magnetostrictive anisotropy field 224 of the cobalt iron layer 242 self-pins the AP pinned layer structure 212 so that a pinning layer is obviated. $Co_{50}Fe_{50}$ has a high positive magnetostriction so that when the magnetic head is lapped to the ABS, compressive stress in the film 242 causes a magnetostriction uniaxial anisotropy field which, after fabrication of the head, can be oriented in a particular direction, such as out of the head, as shown in FIG. 10, by applying a strong magnetic field in that direction. The field strength of the magnetostriction field 224 may be on the order of 500 Oe as compared to 30 Oe for each of the intrinsic fields 222, 220 and 218. The intrinsic uniaxial anisotropies are established during deposition of the layers 214, 240 and 242 in the presence of a field perpendicular to the ABS. When a strong magnetic field is applied out of the head after its completion, for instance, the fields 220, 222 and 224 are likewise oriented out of the head with the field 218 being antiparallel thereto. While the iron layers 214 and 240 have a positive magnetostriction their magnetostrictive fields (not shown)

are overcome by the stronger magnetostriction field 224 of the film 242. This then results in the AP pinned layer structure 212 being self-pinned.

Exemplary thicknesses and materials of the layers and films of the AP pinned layer structure 212 are 20 Å of iron (Fe) for the layer 214, 10 Å of chromium (Cr) for the layer 244, 15 Å of iron (Fe) for the film 240 and 4 Å of cobalt iron ($Co_{50}Fe_{50}$) for the film 242. An aspect of the invention is that the thicknesses and materials of the films 240 and 242 have substantially the same magnetic thickness as the magnetic thickness of the iron layer 214. Self-pinning due to the magnetostrictive field 224 is sufficient to self-pin the AP pinned layer structure 212 in the presence of signal fields from the rotating magnetic disk, as well as other magnetic fields exerted within the disk drive assembly.

Exemplary thickness of the other layers not previously discussed are 500 Å of gallium arsenide (nGaAs) for the collector 202, 20 Å of nickel iron (NiFe) for the layer 230, 20 Å of iron (Fe) for the layer 232, 20 Å of gold (Au) for the spacer layer 208, 10 Å of aluminum oxide ($Al_2O_3$) for the barrier layer 206 and 100 Å of aluminum (Al) for the emitter 204.

With the materials shown for the layers and films in FIG. 10 the hot electrons readily pass through the pinned layer structure 212 when the magnetic moments of the first and second AP pinned layers 214 and 216 are antiparallel and the hot electrons readily pass through the layers 214, 208 and 232 when the magnetic moments 218 and 228 are parallel. An aspect of the invention is that all of the materials and films of the spin valve transistor 74 are 100 oriented crystalline materials except for the barrier layer 206 which is amorphous.

Figure 11:
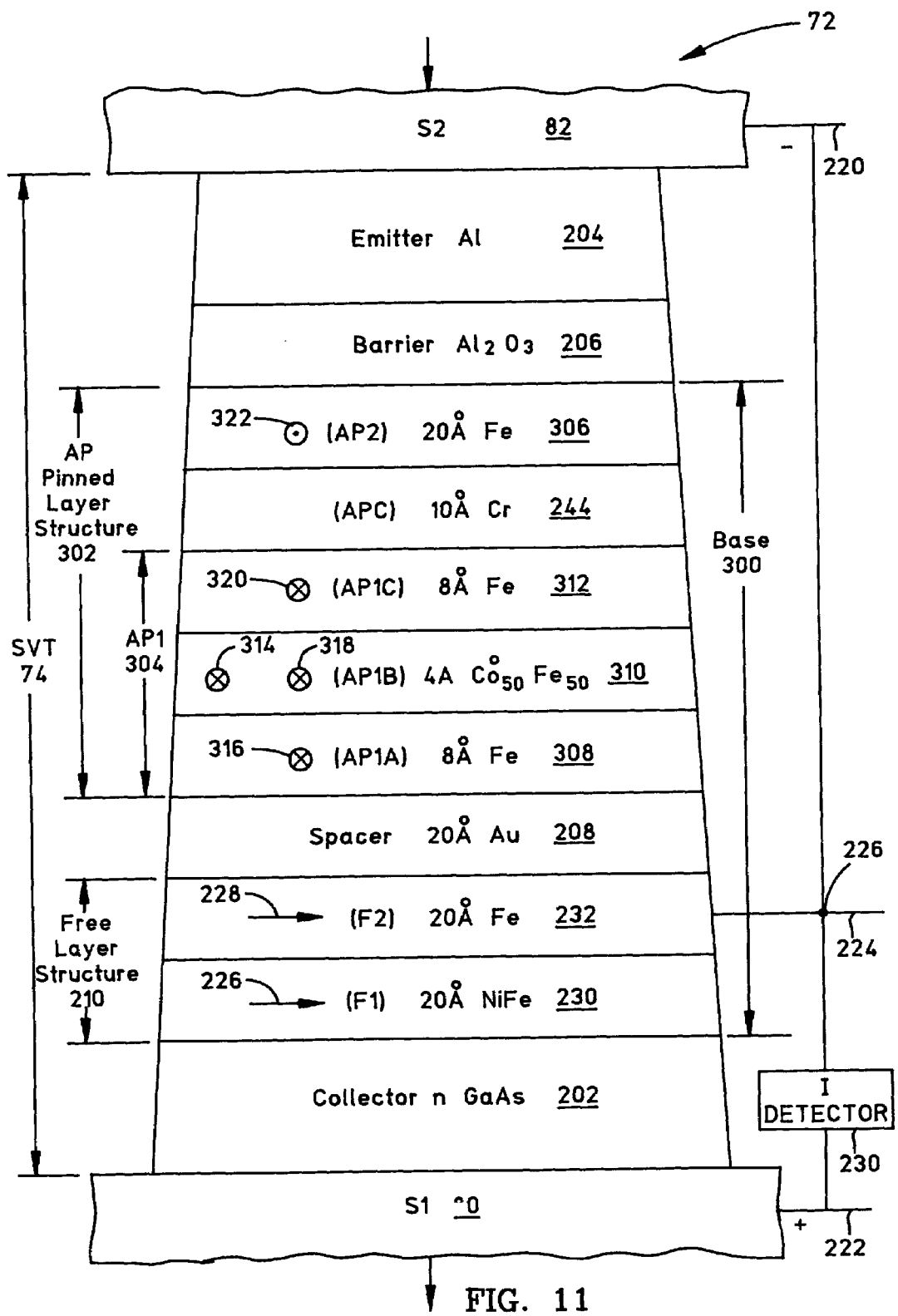
FIG. 11 is an ABS illustration of another embodiment of the present spin valve transistor.

FIG. 11 illustrates a second embodiment of the present invention which is the same as the embodiment shown in FIG. 10 except for the base 300. The base 300 in FIG. 11 is the same as the base 200 in FIG. 10 except for the self-pinned AP pinned layer structure 302. The AP pinned layer structure 302 has first and second AP pinned layers 304 and 306 with the antiparallel coupling (APC) layer 244 located therebetween. An aspect of the invention is that the first AP pinned layer 304 includes first, second and third films (AP1A), (AP1B) and (AP1C) 308, 310 and 312 with the layer 310 being located between the layers 308 and 312. The layer 310 is cobalt iron, such as $Co_{50}Fe_{50}$ and the layers 308 and 312 are iron (Fe). The layer 310 has a magnetostrictive field 314 which self-pins the AP pinned layer structure 302 in the same manner that the magnetostrictive field 224 in FIG. 10 self-pins the AP pinned layer structure 212. The layers 308, 310 and 312 have intrinsic fields 316, 318 and 320 which are antiparallel to an intrinsic field 322 of the layer 306. An aspect of the invention is that the magnetic thickness of the first AP pinned layer 304 be equal to the magnetic thickness of the second AP pinned layer 306. This may be accomplished with the first film 308 being 8 Å of iron (Fe), the second film 310 being 4 Å of cobalt iron ($Co_{50}Fe_{50}$), the third film 312 being 8 Å of iron (Fe) and the second AP pinned layer 306 being 20 Å of iron (Fe). Again, the hot electrons will readily pass through the self-pinned AP pinned layer structure 302 when the magnetic moments of the first and second AP pinned layers 304 and 306 are antiparallel and will readily pass through the layers 308, 208 and 232 when the magnetic moments of the layers 308 and 232 are parallel.

Figure 12:
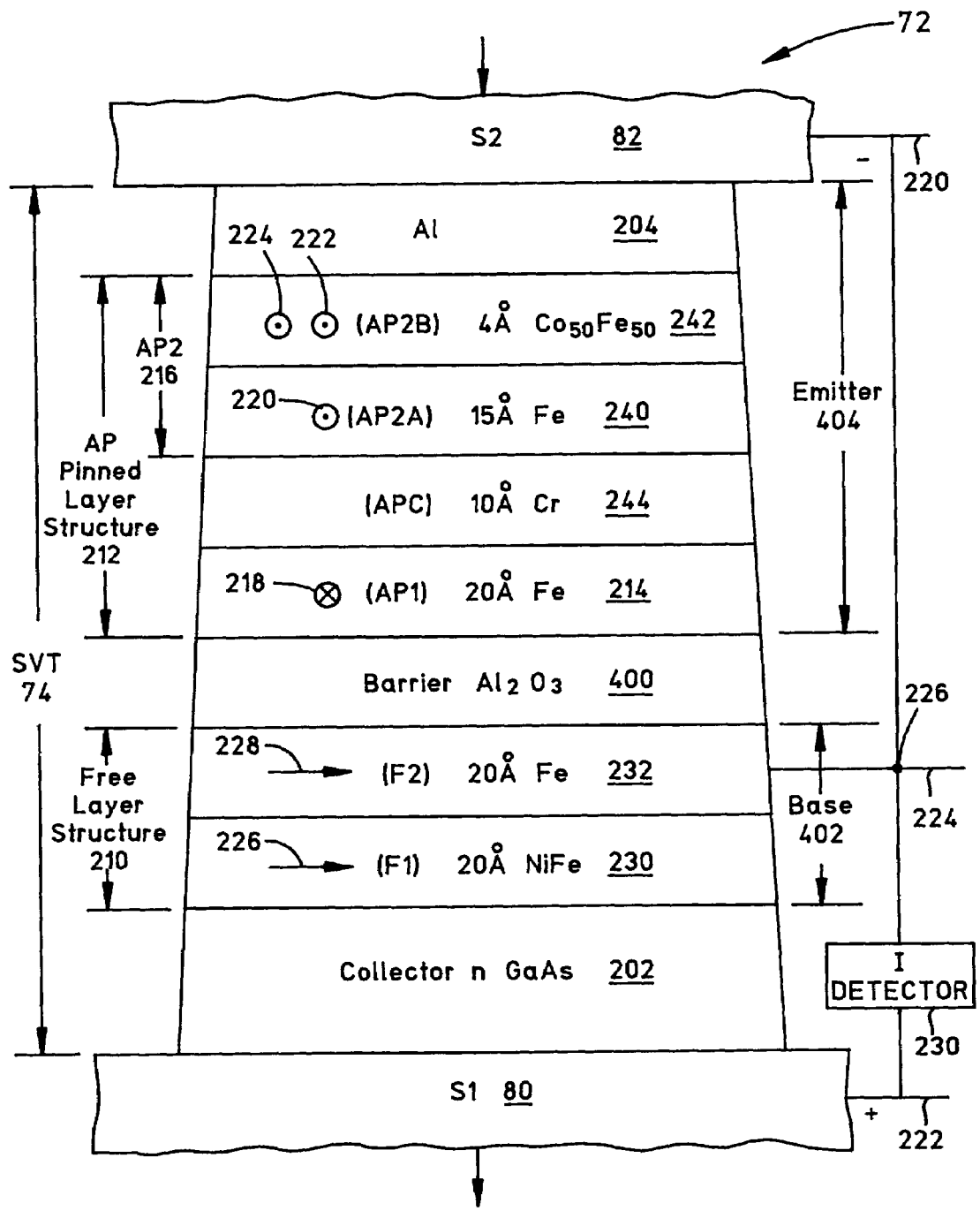
FIG. 12 is an ABS illustration of a further embodiment of the present spin valve transistor.

FIG. 12 illustrates a further embodiment of the read head 72 which is the same as the read head 72 in FIG. 10, except the barrier layer 400 is located between the base 402 and the emitter 404 of the transistor with the base 402 comprising the free layer structure 210 and the emitter 404 comprising the aluminum layer 204 and the AP pinned layer structure 212. In this embodiment the hot electrons are injected by the emitter 404 through the barrier layer 400 into the free layer structure 210.

DISCUSSION

It should be understood that the self-pinned AP pinned layer structures 212 and 302 in FIGS. 10 and 11 may incorporate other materials and thicknesses and still achieve the self-pinning function. However, an aspect of the invention is that one of the films in one of the AP pinned layers be cobalt iron (CoFe) and that the other layers of the AP pinned layer structure be iron (Fe). Further, an aspect of the invention is to employ a cobalt iron with a high magnetostriction, such as $Co_{50}Fe_{50}$. Results can also be achieved with $Co_{90-50}Fe_{30-50}$. It is also an aspect of the invention that the free layer next to the spacer layer 208 be also iron (Fe). It should be understood that the spin valve transistor may be employed in a read head or a memory device. Instead of an air bearing surface the read head may have a head surface for facing a moving magnetic tape drive instead of a rotating disk and disk drive.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

I claim:

1. A spin valve transistor comprising:
   an emitter;
   a collector;
   a base between the emitter and the collector;
   a spin valve including:
      a ferromagnetic free layer structure composed of iron (Fe);
      a self-pinned antiparallel (AP) pinned layer structure;
      a nonmagnetic spacer layer between the free layer structure and the AP pinned layer structure; and
      the free layer structure interfacing the spacer layer;
   the base comprising at least said free layer structure;
   the self pinned AP pinned layer structure including:
      a ferromagnetic first antiparallel (AP) pinned layer;
      a ferromagnetic second antiparallel (AP) pinned layer; and
      a nonmagnetic antiparallel coupling (APC) layer located between the first and second AP pinned layers;
   the first AP pinned layer being composed of iron (Fe) and interfacing the spacer layer;
   the second AP pinned layer including:
      an iron (Fe) film;
      a cobalt iron (CoFe) film with a positive magnetostriction;
      the iron (Fe) film being located between and interfacing the APC layer and the cobalt iron (CoFe) film; and
      the CoFe film having a magnetostrictive anisotropy field that is oriented perpendicular to a head surface of the spin valve transistor for self pinning the AP pinned layer structure.

2. A spin valve transistor as claimed in claim 1 wherein the cobalt iron is $Co_{90-50}Fe_{10-50}$.

3. A spin valve transistor as claimed in claim 1 wherein the cobalt iron (CoFe) film is $Co_{50}Fe_{50}$.

4. A spin valve transistor as claimed in claim 3 wherein the first and second AP pinned layers have the same magnetic thickness.

5. A spin valve transistor as claimed in claim 3 wherein the base further comprises the self-pinned antiparallel (AP) pinned layer structure and the spacer layer.

6. A spin valve transistor as claimed in claim 5 further comprising a barrier layer located between the emitter and the base for conducting hot electrons from the emitter to the base wherein the hot electrons have an energy level above Fermi levels of the layers in said base.

7. A spin valve transistor as claimed in claim 6 wherein the first and second AP pinned layers have the same magnetic thickness.

8. A magnetic head assembly comprising:
   a write head;
   a read head adjacent the write head;
   the read head including:
      ferromagnetic first and second shield layers; and
      a spin valve transistor located between the first and second shield layers;
   the spin valve transistor comprising:
      an emitter;
      a collector;
      a base between the emitter and the collector;
      a spin valve including:
         a ferromagnetic free layer structure composed of iron (Fe);
         a self-pinned antiparallel (AP) pinned layer structure;
         a nonmagnetic spacer layer between the free layer structure and the AP pinned layer structure; and
         the free layer structure interfacing the spacer layer;
      the base comprising at least said free layer structure;
      the self pinned AP pinned layer structure including:
         a ferromagnetic first antiparallel (AP) pinned layer;
         a ferromagnetic second antiparallel (AP) pinned layer; and
         a nonmagnetic antiparallel coupling (APC) layer located between the first and second AP pinned layers;
      the first AP pinned layer being composed of iron (Fe) and interfacing the spacer layer;
      the second AP pinned layer including:
         an iron (Fe) film;
         a cobalt iron (CoFe) film with a positive magnetostriction;
         the iron (Fe) film being located between and interfacing the APC layer and the cobalt iron (CoFe) film; and
         the CoFe film having a magnetostrictive anisotropy field that is oriented perpendicular to a head surface of the spin valve transistor for self pinning the AP pinned layer structure.

9. A magnetic head assembly as claimed in claim 8 wherein the cobalt iron is $Co_{90-50}Fe_{10-50}$.

10. A magnetic head assembly as claimed in claim 8 wherein the cobalt iron is $Co_{50}Fe_{50}$.

11. A magnetic head assembly as claimed in claim 10 wherein the first and second AP pinned layers have the same magnetic thickness.

12. A magnetic head assembly as claimed in claim 10 wherein the base further comprises the self-pinned antiparallel (AP) pinned layer structure and the spacer layer.

13. A magnetic head assembly as claimed in claim 12 further comprising a barrier layer located between the emitter and the base for conducting hot electrons from the emitter to the base wherein the hot electrons have an energy level above Fermi levels of the layers in said base.

14. A magnetic head assembly as claimed in claim 13 wherein the first and second AP pinned layers have the same magnetic thickness.

15. A magnetic disk drive comprising:
   at least one magnetic head assembly that has a head surface;
   the magnetic head assembly having a write head and a read head;
   the read head including:
      ferromagnetic first and second shield layers; and
      a spin valve transistor located between the first and second shield layers;
   the spin valve transistor comprising:
      an emitter;
      a collector;
      a base between the emitter and the collector;
      a spin valve including:
         a ferromagnetic free layer structure composed of iron (Fe);
         a self-pinned antiparallel (AP) pinned layer structure;
         a nonmagnetic spacer layer between the free layer structure and the AP pinned layer structure; and
         the free layer structure interfacing the spacer layer;
      the base comprising at least said free layer structure;
      the self pinned AP pinned layer structure including:
         a ferromagnetic first antiparallel (AP) pinned layer;
         a ferromagnetic second antiparallel (AP) pinned layer; and
         a nonmagnetic antiparallel coupling (APC) layer located between the first and second AP pinned layers;
      the first AP pinned layer being composed of iron (Fe) and interfacing the spacer layer;
      the second ALP pinned layer including:
         an iron (Fe) film with a positive magnetostriction;
         a cobalt iron (CoFe) film;
         the iron (Fe) film being located between and interfacing the APC layer and the cobalt iron (CoFe) film; and
         the CoFe film having a magnetostrictive anisotropy field that is oriented perpendicular to a head surface of the spin valve transistor for self pinning the AP pinned layer structure;
   a housing;
   a magnetic medium supported in the housing;
   a support mounted in the housing for supporting the magnetic head assembly with said head surface facing the magnetic medium so that the magnetic head assembly is in a transducing relationship with the magnetic medium;
   a motor for moving the magnetic medium; and
   a processor connected to the magnetic head assembly and to the motor for exchanging signals with the magnetic head assembly and for controlling movement of the magnetic medium.

16. A magnetic disk drive as claimed in claim 15 wherein the cobalt iron is $Co_{90-50}Fe_{10-50}$.

17. A magnetic disk drive as claimed in claim 15 wherein the cobalt iron is $Co_{50}Fe_{50}$.

18. A magnetic disk drive as claimed in claim 17 wherein the first and second AP pinned layers have the same magnetic thickness.

19. A magnetic disk drive as claimed in claim 17 wherein the base further comprises the self-pinned antiparallel (AP) pinned layer structure and the spacer layer.

20. A magnetic disk drive as claimed in claim 19 further comprising a barrier layer located between the emitter and the base for conducting hot electrons from the emitter to the base wherein the hot electrons have an energy level above Fermi levels of the layers in said base.

21. A magnetic disk drive as claimed in claim 20 wherein the first and second AP pinned layers have the same magnetic thickness.

* * * * *